(12) United States Patent
Smith et al.

(10) Patent No.: US 8,675,695 B2
(45) Date of Patent: Mar. 18, 2014

(54) METHOD FOR FINDING AND TRACKING SINGLE-MODE OPERATION POINT OF EXTERNAL CAVITY DIODE LASERS

(75) Inventors: Paul C. Smith, Louisville, CO (US);
Jason R. Ensher, Lafayette, CO (US);
Paul A. Morrison, Longmont, CO (US);
Keith W. Malang, Longmont, CO (US);
Roger Shepherd, Nederland, CO (US);
William G. Creech, Longmont, CO (US)

(73) Assignee: Akonia Holographics, LLC, Longmont, CO (US)

( * ) Notice: Subject to any disclaimer, the term of this patent is extended or adjusted under 35 U.S.C. 154(b) by 0 days.

(21) Appl. No.: 13/557,247

(22) Filed: Jul. 25, 2012

(65) Prior Publication Data
US 2012/0287491 A1 Nov. 15, 2012

Related U.S. Application Data

(62) Division of application No. 12/562,568, filed on Sep. 18, 2009, now Pat. No. 8,254,418.

(60) Provisional application No. 61/098,445, filed on Sep. 19, 2008.

(51) Int. Cl.
*H01S 3/098* (2006.01)

(52) U.S. Cl.
USPC .............................................. 372/18; 372/19

(58) Field of Classification Search
USPC ................. 372/18, 29.015, 29.021, 38.02, 19
See application file for complete search history.

(56) References Cited

U.S. PATENT DOCUMENTS

| 6,103,454 | A | 8/2000 | Dhar et al. |
|---|---|---|---|
| 6,482,551 | B1 | 11/2002 | Dhar et al. |
| 6,650,447 | B2 | 11/2003 | Curtis et al. |
| 6,743,552 | B2 | 6/2004 | Setthachayanon et al. |
| 6,765,061 | B2 | 7/2004 | Dhar et al. |
| 6,780,546 | B2 | 8/2004 | Trentler et al. |
| 7,397,571 | B2 * | 7/2008 | Krneta et al. ................. 356/520 |
| 7,495,838 | B2 | 2/2009 | Krneta et al. |
| 7,521,154 | B2 | 4/2009 | Trentler |

(Continued)

OTHER PUBLICATIONS

McLeod, et al., "Micro-Holographic Multi-Layer Optical Disk Data Storage," Interntional Symposium on Optical Memory and Optical Data Storage, Jul. 2005.

(Continued)

*Primary Examiner* — Armando Rodriguez
(74) *Attorney, Agent, or Firm* — Akonia Holographics, LLC; Albert Haegele

(57) ABSTRACT

An apparatus comprising: a processor for determining if a laser is operating in a single-mode state and for determining the degree to which one of one or more tunable parameters for the laser must be adjusted so that laser operates in a single-mode state if not operating in a single-mode state, wherein the one or more tunable parameters include the following parameters: the laser current and the wavelength of the output light. The apparatus may include a laser and/or a holographic storage medium. Also provided is a method for determining if a laser is operating in a single-mode state and for determining the degree to which one of one or more tunable parameters for the laser must be adjusted so that laser operates in a single-mode state if not operating in a single-mode state.

13 Claims, 5 Drawing Sheets

(56) References Cited

U.S. PATENT DOCUMENTS

| | | |
|---|---|---|
| 2003/0206320 A1 | 11/2003 | Cole et al. |
| 2006/0109873 A1* | 5/2006 | Crosson et al. ............... 372/19 |
| 2007/0223554 A1 | 9/2007 | Hunter et al. |
| 2009/0323737 A1 | 12/2009 | Ensher et al. |

OTHER PUBLICATIONS

Psaltis, et al., "Holographic Memories," Scientific American, Nov. 1995.

Non Final Office Action received for U.S. Appl. No. 12/562,568, mailed on Feb. 1, 2012, 10 pages.

Non Final Office Action received for U.S. Appl. No. 12/562,568, mailed on Jul. 26, 2011, 8 pages.

Notice of Allowance received for U.S. Appl. No. 12/562,568, mailed on May 29, 2012, 7 pages.

* cited by examiner

METHOD FOR FINDING AND TRACKING SINGLE-MODE OPERATION POINT OF EXTERNAL CAVITY DIODE LASERS

CROSS-REFERENCE TO RELATED APPLICATIONS

This application is a divisional of U.S. patent application Ser. No. 12/562,568, filed Sep. 18, 2009, allowed, which claims the priority date from U.S. Provisional Patent Application No. 61/098,445 filed Sep. 19, 2008. The entire disclosure and contents of the foregoing U.S. patent applications are hereby incorporated by reference.

FIELD OF THE INVENTION

The present invention broadly relates generally to external cavity laser diode (ECLD) systems and methods.

BACKGROUND

Developers of information storage devices continue to seek increased storage capacity. As part of this development, holographic memory systems have been suggested as alternatives to conventional memory devices. Holographic memory systems may be designed to record data one bit of information (i.e., bit-wise data storage). See McLeod et al. "Micro-Holographic Multi-Layer Optical Disk Data Storage," *International Symposium on Optical Memory and Optical Data Storage* (July 2005). Holographic memory systems may also be designed to record an array of data that may be a 1-dimensional linear array (i.e., a 1×N array, where N is the number linear data bits), or a 2-dimension array commonly referred to as a "page-wise" memory systems. Page-wise memory systems may involve the storage and readout of an entire two-dimensional representation, e.g., a page of data. Typically, recording light passes through a two-dimensional array of dark and transparent areas representing data, and the system stores, in three dimensions, the pages of data holographically as patterns of varying refractive index imprinted into a storage medium. See Psaltis et al., "Holographic Memories," *Scientific American*, November 1995, where holographic systems are discussed generally, including page-wise memory systems.

In a holographic data storage system, information is recorded by making changes to the physical (e.g., optical) and chemical characteristics of the holographic storage medium. These changes in the holographic storage medium take place in response to the local intensity of the recording light. That intensity is modulated by the interference between a data-bearing beam (the data beam) and a non-data-bearing beam (the reference beam). The pattern created by the interference of the data beam and the reference beam forms a hologram which may then be recorded or written in the holographic storage medium. If the data-bearing beam is encoded by passing the data beam through, for example, a spatial light modulator (SLM), the hologram(s) may be recorded or written in the holographic storage medium as holographic data.

External cavity laser diodes (ECLDs) are useful light sources for applications in spectroscopy, telecommunications and holography. Holographic data storage also illustrates an application with three requirements that an ECLD meets: wide wavelength tuning range, operation in a single-longitudinal mode, and output powers in the tens of milliwatts. In some holographic data storage approaches, the operating wavelength range may be in the range of from about 402 to about 408 nm. Since holograms are created by interference, single-longitudinal mode operation may be necessary to form holograms having a high signal-to-noise ratio. Finally, the created holograms, which are stored in a holographic storage medium, depend upon the number of photons delivered to the storage medium.

SUMMARY

According to a first broad aspect of the present invention, there is provided an apparatus comprising: a laser having a laser current and an output light having a wavelength; and a processor for determining if the laser is operating in a single-mode state and for determining the degree to which one of one or more tunable parameters for the laser must be adjusted so that laser operates in a single-mode state if not operating in a single-mode state, wherein the one or more tunable parameters include the following parameters: the laser current and the wavelength of the output light.

According to a second broad aspect of the present invention, there is provided a method comprising the following steps: (a) determining if a laser is operating in a single-mode state, the laser having a laser current and an output light having a wavelength; and (b) if the laser is determined to not be operating in a single-mode state in step (a), determining the degree to which one of one or more tunable parameters for the laser must be adjusted so that the laser operates in a single-mode state if not operating in a single-mode state, wherein the one or more tunable parameters include the following parameters: the laser current and the wavelength of the output light.

According to a third broad aspect of the present invention, there is provided an apparatus comprising: a holographic storage medium for recording holograms using a tunable laser having a laser current and an output light having a wavelength; and a processor for determining if the laser is operating in a single-mode state and for determining the degree to which one of one or more tunable parameters for the laser must be adjusted so that laser operates in a single-mode state if not operating in a single-mode state, wherein the one or more tunable parameters include the following parameters: the laser current and the wavelength of the output light.

BRIEF DESCRIPTION OF THE DRAWINGS

Embodiments of the present invention will be described in conjunction with the accompanying drawings, in which.

DETAILED DESCRIPTION

Figure 1:
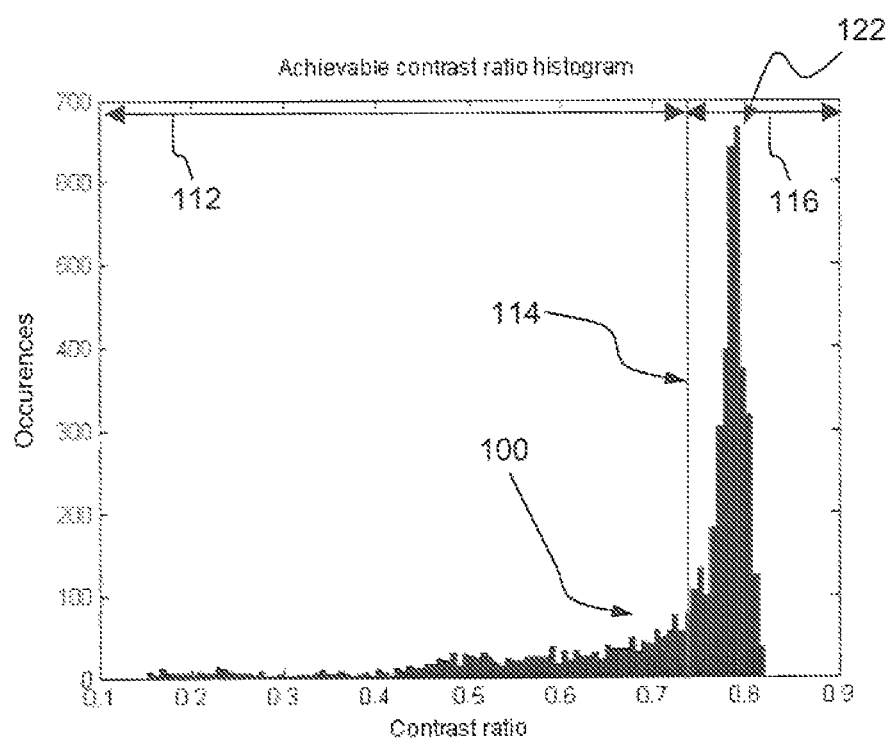
FIG. 1 is a histogram of a range of contrast ratios made from multiple current sweeps while tuning the wavelength of the external cavity laser diode.

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, directional terms such as "top," "bottom," "above," "below," "left," "right," "horizontal" "vertical," "up," "down," etc., are merely used for convenience in describing the various embodiments of the present invention. The embodiments of the present invention may be oriented in various ways. For example, the devices, diagrams, graphs, images, etc., shown in FIGS. 1 through 3 may be flipped over, rotated by 90° in any direction, or reversed, etc.

For the purposes of the present invention, a value or property is "based" on a particular value, property, the satisfaction of a condition, or other factor, if that value is derived by performing a mathematical calculation or logical decision using that value, property, condition, or other factor.

For the purposes of the present invention, the term "angle of incidence" refers to the angle between a light ray incident on a surface and the line perpendicular to that surface (the normal) at the point of incidence.

For the purposes of the present invention, the term "Automatic Mode Control (AMC) process" refers to a process which may be used to keep a laser, such as an ECLD, tuned to operate as a single-mode laser. In one embodiment of the present invention, the AMC process starts to adjust current and/or wavelength when the contrast ratio of a laser is below the set point threshold.

For the purposes of the present invention, the term "AMC current range" refers to a parameter that refers to the amount that the current is adjusted for the laser before the wavelength of the laser is adjusted by the AMC process in one embodiment of the present invention.

For the purposes of the present invention, the term "current step" refers to a constant amount by which the AMC process adjusts laser current in embodiments of the present invention. In one embodiment, the current step is 50 microamps (mA).

For the purpose of the present invention, the terms "contrast ratio" or "fringe visibility" (also known as "interference visibility" or "interferometric visibility") refer interchangeably to the quantified contrast of an interference (fringe pattern) in a system which has wave-like properties. Generally, when two or more waves are combined and as the phase between them is changed (e.g., in an interferometer), the power or intensity of the resulting wave oscillates, thus forming an interference pattern. The ratio of the size or amplitude of these oscillations to the sum of the powers of the individual waves is defined as the visibility or contrast ratio. In one embodiment of the present the contrast ratio is obtained by comparing a scaled contrast value to a scaled maximum contrast value. In an embodiment, the contrast value may vary from 0 to 1023. However, the measured contrast value is adjusted to fit as scale of 0 to 736 for generating scaled contrast value by dividing the contrast value on the 0 to 1023 scale by 1.39. The scaling of the contrast value is performed to allow for using a Fourier Transform method to calculate the contrast ratio of a fringe pattern, which is more accurate than directly measuring the maximum and minimum of a fringe pattern. The Fourier transform method yields contrast ratio values that are precisely lower than the correct contrast ratio by a scale factor, as described using techniques such as those described in commonly assigned U.S. patent application Ser. No. 12/457,498, entitled "SYSTEM AND DEVICES FOR IMPROVING EXTERNAL CAVITY DIODE LASERS USING WAVELENGTH AND MODE SENSORS AND COMPACT OPTICAL PATHS" (Ensher et al.), filed Jun. 12, 2009, the entire contents and disclosure of which is hereby incorporated by reference.

Figure 2:
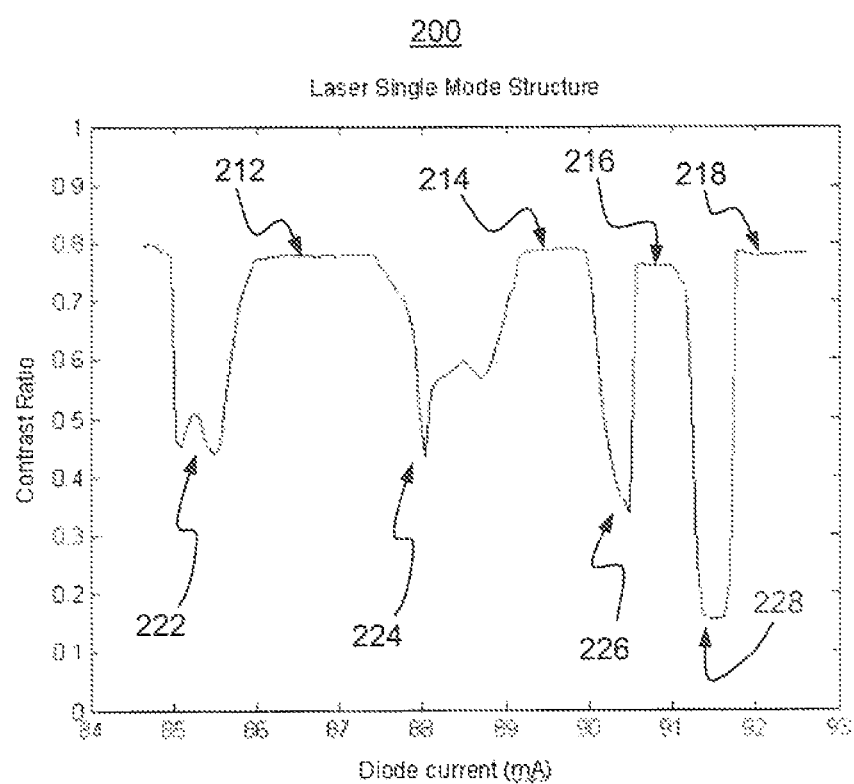
FIG. 2 is a plot of the contrast ratio versus the external cavity laser diode (ECLD) current, wherein the ECLD current is tuned within the range of from about 84.5 mA to about 92.8 mA.
Figure 3:
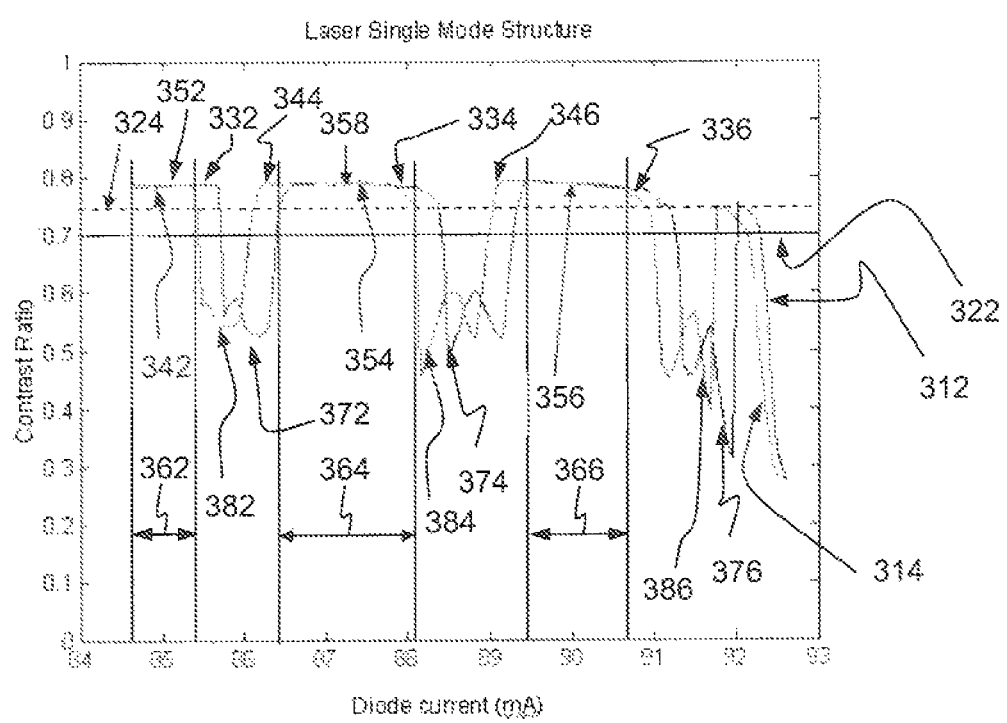
FIG. 3 is a plot of the contrast ratio versus the ECLD current tuned within the current range of from about 84.5 mA to about 92.8 mA for up and down ECLD current sweeps, and indicating the chosen operating current for the ECLD of the widest overlapping single-mode plateau of the up and down current sweeps.

For the purposes of the present invention, the term "contrast ratio plateau" refers to contiguous series of currents for a laser where the contrast ratio is relatively constant as the laser current changes. In one embodiment of the present invention, the contrast ratio is considered "constant" if the contrast ratio differs by about 13 units (on a scale of 0 to 736 units) or less. Examples of contrast ratio plateaus are shown in FIGS. 2 and 3.

For the purposes of the present invention, the term "current update delay" refers to the time between adjusting the laser current and when the status of the laser is checked during the AMC process according to one embodiment of the present invention.

For the purposes of the present invention, the term "diffraction grating" refers to an optical component whose optical properties may be periodically modulated and which results in the incoming light exiting the grating with an angle which is dependent upon the wavelength of the incident light. Diffraction gratings have a regular or repeating pattern which can split (diffract) light into a plurality of beams travelling in different directions. Diffraction gratings may be reflective or transmissive.

For the purposes of the present invention, the term "external laser cavity" refers to a laser cavity which is external to a component of an ECLD which is the source of photons and optical gain. Exemplary external laser cavities comprise the portion of an ECLD between a laser diode and a diffraction grating (including any collimating lens positioned between the laser diode and the diffraction grating), etc. External laser cavities often provide control over the longitudinal and/or transverse mode structure of the laser diode of the ECLD.

For the purposes of the present invention, the term "fringe pattern" refers to the pattern of interference fringes formed by the interaction, intersection, and/or interference, etc., of two or more light beams. Fringe patterns are illustrated, for example, in FIGS. 4, 5 and 13, as well as the corresponding description, in commonly-assigned U.S. Pat. No. 7,397,571 (Krneta et al.), issued Jul. 8, 2008, the entire disclosure and contents of which is hereby incorporated by reference For the purposes of the present invention, the term "full-width half maximum" (FWHM) refers to an expression of the extent of a function, given by the difference between the two extreme values of the independent variable at which the dependent variable is equal to half of the maximum value of the dependent variable.

For the purposes of the present invention, the term "initial wavelength" refers to the initial wavelength of a laser. In one embodiment of the present invention, the AMC process has an initial wavelength which is set and which is initially held constant as the laser current is adjusted. If the laser is at the initial wavelength for the laser and the amount of current adjustment necessary to achieve single-mode operation equals the maximum current range, the initial wavelength is adjusted by a wavelength step. In one embodiment, the initial wavelength may be from 402 to 408 nm. The initial wavelength may be affected by the temperature of the holographic medium in which the laser records holograms.

For the purposes of the present invention, the term "laser current" refers to the current applied to the laser diode. In the AMC process of the present invention, the contrast ratio for the output light of a laser may be adjusted by adjusting the laser diode current.

For the purposes of the present invention, the term "laser wavelength precision value" refers to the tolerance that is allowed between the requested laser wavelength and the final laser wavelength. In one embodiment of the present invention, a set wavelength request in the AMC process invokes a process that adjusts the grating to converge to the requested wavelength value until the actual value is within the laser wavelength precision of the requested wavelength.

For the purposes of the present invention, the term "maximum current range" refers to an amount that the laser current may be changed before it is necessary to bump the wavelength of the output light of a laser when employing the AMC process of one embodiment of the present invention. The "maximum current range" may be determined by the resulting change in the output power of the laser. For instance, a 1 mA change in the laser diode current may cause a 0.5 mW change in the output power of the laser. Over a certain current range, the change in output power of the laser may not change the signal to noise strength of the holograms produced (the range is precisely dependent on details of the holographic drive such as amount of light actually delivered to a holographic media, the amount of scattered light produced, etc.). In one embodiment, the maximum current range is 3000 microamps (mA).

For the purposes of the present invention, the term "maximum wavelength range" refers to the total change in wavelength that the AMC process is allowed to perform before indicating that the AMC process has failed or that the algorithm must return to the initial wavelength requested and try again. The maximum wavelength range for a laser may be determined by the wavelength-dependent response of the holographic media, which may exhibit a peak response over hundreds of picometers.

For the purposes of the present invention, the term "mode hop" refers to an integral change in the of longitudinal modes supported by a laser cavity. A mode hop may occur as the ECLD wavelength or laser diode current are tuned due to a change in the cavity length or change in the wavelength of light that is selected by the grating to be supported by the cavity.

For the purposes of the present invention, the term "mode number" refers to the number of half wavelengths of a particular wavelength of light that fits within a laser cavity.

For the purposes of the present invention, the term "non-output beam" refers to a beam produced by, for example, an ECLD which do not provide output from the laser cavity. Non-output beams may include, for example, specularly reflected beams (R0), reflected diffraction order beams (R−1), and/or transmitted diffraction order beams (T1).

For the purposes of the present invention, the term "current optimization procedure" refers to a portion of the AMC process in which one or more contrast ratio plateaus above the control point threshold are located and the laser current is set in the middle of the plateau thereby defining an "optimized (laser) current" for the laser. In one embodiment of the present invention, the optimizing current procedure sets the operating current for the laser at the approximate midpoint of the largest plateau above the control point threshold if a single current sweep is performed on the laser or at the midpoint of the largest overlapping plateau if multiple current sweeps are performed. In one embodiment of the present invention, the AMC process sweeps over a range of 3000 microamps (3 mA) to determine an optimized current.

For the purposes of the present invention, the term "overlapping single-mode (SM) plateau" refers the a current range where two or more SM plateaus overlap.

For the purposes of the present invention, the term "position sensitive detector (PSD)" refers to a device which detects and enables position measurement to be made, determined, and/or calculated, etc. The PSD may be one-dimensional (linear), two-dimensional, or three-dimensional. PSDs may include a photodiode array, e.g., a bicell or quad cell photodiode; a diffraction grating sensor; CMOS camera; and a CCD, e.g., a CCD linear array, etc.

For the purposes of the present invention, the term "reflected diffraction order beam (R1)" refers to a beam produced by the diffraction grating of an ECLD which is often used to provide feedback to the laser diode.

For the purposes of the present invention, the term "reflective diffraction grating" refers to a diffraction grating in which all or at least most of the light which reaches the grating is reflected. Reflective diffraction gratings comprise a reflective surface, coating, or substrate, etc., which permits the non-diffracted light to be reflected from the substrate.

For the purposes of the present invention, the term "initial power" refers to the initial output power level to which an external cavity laser in an AMC process, according to one embodiment of the present invention, is set. In one embodiment, the initialization part of the AMC process attempts to set a starting requested power as the initial power for a laser. If the initialization part of the AMC process determines that the laser cannot be operated in single-mode at the starting requested power, even with adjustments to the laser current, the AMC process selects a new target power and tries to set a new starting requested power that as the initial power. This process is repeated until the initialization part of the AMC process determines that the laser can be operated, possibly with laser current adjustments, in single-mode at the starting requested power and sets the starting requested power as the initial power for the laser.

For the purposes of the present invention, the term "sensor array" refers to a set of several sensors which an information gathering device uses to gather data which may not be gathered from a single source.

For the purposes of the present invention, the term "shearing interferometer" refers to a testing device which comprises a plate made of, for example, a high quality optical glass (e.g., BK-7) with extremely flat optical surfaces and usually having a slight angle between them (e.g., is wedge-shaped). When a plane wave is incident to the glass plate at an angle of 45 degrees (which gives maximum sensitivity) it is reflected twice, with the two reflections being laterally separated due to the finite thickness of the plate and by the wedge shape of the plate. This "separation" is referred to as the "shear" which gives the interferometer its name. Shearing interferometers may be used to observe interference and to use this phenomenon to test the collimation of light beams, especially from laser sources (e.g., laser diodes of ECLDs) which have a coherence length which may be a lot longer than the thickness of the shear plate so that the basic condition for interference is fulfilled.

For the purposes of the present invention, the term "single-mode (SM) plateau" refers to a contrast ratio plateau in a region where an ECLD operates as a single-mode laser. Examples of SM plateaus are shown in FIGS. 2 and 3.

For the purposes of the present invention, the term "specularly reflected beam (R0)" refers to a beam produced by the diffraction grating of an ECLD which provides a mirror-like reflection of the light originally impacting upon the grating.

For the purposes of the present invention, the term "transmissive diffraction grating" refers to a diffraction grating which permits a portion of the light to pass through the grating. Transmissive diffraction gratings comprise a transparent material, element, component, structure, and/or substrate, etc., which permits the non-diffracted light to be transmitted (pass) through the substrate. Exemplary transmissive diffraction gratings may comprise devices capable of diffracting a portion of light at a particular wavelength which passes through the device back along the same path upon which the incoming light traveled.

For the purposes of the present invention, the term "transmitted beam (T0)" refers to a beam produced by the diffraction grating of an ECLD which provides output (an output beam) from the laser cavity.

For the purposes of the present invention, the term "transmitted diffraction beam (T1)" refers to a beam produced by the diffraction grating of an ECLD which passes through (is transmitted by) the grating.

For the purposes of the present invention, the term "tune" refers to adjusting a device to a desired state. For example, in exemplary embodiments, a diffraction grating may be tuned by adjusting the particular wavelength reflected (or transmitted) by the diffraction grating to a desired wavelength. In other embodiments, the device may be tuned adjusting and controlling the degree of coherence of the laser mode.

For the purposes of the present invention, the terms "laser cavity," "optical cavity," "optical resonator," or "laser resonator" (hereafter collectively referred to as "laser cavity") refers to a space between two reflective devices, elements, etc., of an ECLD. Exemplary laser cavities may comprise the space between, for example, the space between reflective coatings on a facet of a laser diode, the space between a laser diode and a diffraction grating, etc.

For the purposes of the present invention, the term "coherent light beam" refers to a beam of light including waves with a particular (e.g., constant) phase relationship, such as, for example, a laser beam.

For the purposes of the present invention, the term "light source" refers to a source of electromagnetic radiation having a single wavelength or multiple wavelengths. The light source may be from a laser, a laser diode, and/or a light emitting diode (LED), etc.

For the purposes of the present invention, the term "bump" refers to adjusting a wavelength of a laser by the wavelength step for the laser.

For the purposes of the present invention, the term "chip mode" refers to a longitudinal cavity mode of an ECLD that is determined by the cavity formed between the reflective facets of the laser diode chip. During tuning of the ECLD, the modes of external cavity formed between the diffraction grating and one facet of the laser diode primarily control the mode of the ECLD. Occasionally, the cavity formed by the laser diode chip can force the mode of the ECLD to change into alignment with the modes of the chip, creating mode hops that reduce contrast ratio and are detrimental to producing strong holograms. Sometimes the state of the laser when it is mode hopping due to the transition into a cavity mode supported by the laser diode chip is referred to as a "chip mode" of the ECLD.

For the purposes of the present invention, the term "current dither" refers to quickly changing the ECLD current back and forth during operation of the AMC process.

For the purposes of the present invention, the term "current dither cycle" refers to one such back and forth current dithering.

For the purposes of the present invention, the term "current sweep" refers to adjusting the current for a laser over a range of currents and observing the contrast ratios for each current value.

For the purposes of the present invention, the term "data beam" refers to a recording beam containing a data signal. As used herein, the term "data modulated beam" refers to a data beam that has been modulated by a modulator such as a spatial light modulator (SLM).

For the purposes of the present invention, the term "data modulator" refers to any device that is capable of optically representing data in one or two-dimensions from a signal beam.

For the purposes of the present invention, the term "data page" or "page" refers to the conventional meaning of data page as used with respect to holography. For example, a data page may be a page of data, one or more pictures, etc., to be recorded or recorded in a holographic storage medium.

For the purposes of the present invention, the terms "detector" and "sensor" refer interchangeably to any type of device capable of detecting or sensing something, for example, light. Exemplary detectors or sensors include devices capable of detecting the presence or intensity of light, or a fringe pattern. Examples of detectors or sensors may include a complementary metal-oxide-semiconductor (CMOS) camera, a charged coupled detector (CCD), and/or a quad cell photodiode, etc.

For the purposes of the present invention, the terms "external cavity laser," "external cavity diode laser," and "external cavity laser diode (ECLD)," (hereinafter collectively referred to as "ECLD") refers to a device comprising a laser diode, a diffraction grating, and at least one reflective optical element which may be used to introduce optical feedback into the gain medium (e.g., laser diode chip). The combination of one or more reflective elements, possibly including the diffraction grating, may be referred to interchangeably as a "laser cavity," "(external) optical cavity," "optical resonator," or "laser resonator" (hereafter referred to collectively as "laser cavity"). This laser cavity may be used to convert a single wavelength of light emitted from the laser diode having a predetermined bandwidth to a specific wavelength. ECLDs may comprise a laser diode chip having one end provided with an anti-reflection (AR) coating, while the other end has at least a partial reflection (PR), and often a high reflection (HR), coating, with the laser cavity extending from the HR coating end to a diffraction grating (known as a "Littrow-configuration") to provide a single-mode of light. The wavelength of a Littrow ECLD may be tuned by rotating the grating such that it selects a different wavelength of light within the gain of the laser diode chip. A collimating lens may also be provided between the AR coating and the diffraction grating, as well as an output coupler mirror (positioned to receive the output beam from the diffraction grating, especially for reflective gratings). In an alternative ECLD design, known as the Littman-Metcalf configuration, the external cavity may that comprise the HR coated end of the laser diode and an external mirror, with the diffraction grating placed between them and used in reflection. The output of the laser may be produced by a direct reflection from the grating, while a diffracted beam from the grating is directed to the external mirror. The external mirror provides the feedback to the laser diode, forming the cavity. The wavelength of a Littman-Metcalf configuration ECLD may be tuned by rotating the external mirror to selectively couple light of different wavelengths back to the laser diode. Alternatively, the ECLD may use a laser cavity based on an optical fiber with the optical feedback coming from a fiber Bragg grating. See also, for example, commonly-assigned U.S. Pat. No. 7,495,838 (Krneta et al.), issued Feb. 24, 2009, the entire disclosure and contents of which is hereby incorporated by reference, for an illustrative ECLD having an AR coating on one facet of the diode crystal and a HR coating on the other, opposite facet of the diode crystal.

For the purposes of the present invention, the term "external cavity laser (ECL or ECLD) data" refers to data received, or obtained, etc., from the ECLD which may be used to determine the degree to which the ECLD is (or is not) operating in a single-modes state. Such data may include contrast ratio, fringe visibility, output power, wavelength, optical spectrum, etc.

For the purposes of the present invention, the term "external cavity multimode" refers to a state of an external cavity laser consisting of multiple longitudinal or transverse modes of the external optical cavity lasing simultaneously with non-zero optical power. One mode may be predominant, but other modes, sometimes called side-modes, of lower optical power may be present in the cavity and appear in the optical spectrum.

For the purposes of the present invention, the term "external cavity single-mode" refers to a state of an external cavity laser consisting of only one longitudinal or transverse mode of the cavity. Only one mode possesses optical power, which appears as a single feature or line in an optical spectrum For the purposes of the present invention, the term "good hologram" refers to a hologram whose signal-to-noise ratio is within about 1 dB, and, in one embodiment of the present invention, preferably not greater than 0.2 dB less than the signal-to-noise ratio determined by the holographic drive parameters.

For the purposes of the present invention, the term "histogram" refers to an assembly, and/or compilation, etc., of contrast ratios measured versus the ECLD current for many different diffraction grating angles.

For the purposes of the present invention, the terms "holographic grating," "holograph" or "hologram" (collectively and interchangeably referred to hereafter as "hologram") are used in the conventional sense of referring to an interference pattern formed when a signal beam and a reference beam interfere with each other. In cases where digital data is recorded page-wise, the signal beam may be encoded with a data modulator, e.g., a spatial light modulator, etc.

For the purposes of the present invention, the term "holographic recording" refers to the act of recording a hologram in a holographic storage medium. The holographic recording may provide bit-wise storage (i.e., recording of one bit of data), may provide storage of a 1-dimensional linear array of data (i.e., a 1×N array, where N is the number linear data bits), or may provide 2-dimensional storage of a page of data.

For the purposes of the present invention, the term "holographic storage medium" refers to a component, and/or material, etc., that is capable of recording and storing, in three dimensions (i.e., the X, Y and Z dimensions), one or more holograms (e.g., bit-wise, linear array-wise or page-wise) as one or more patterns of varying refractive index imprinted into the medium. Examples of holographic media useful herein include, but are not limited to, those described in: U.S. Pat. No. 6,103,454 (Dhar et al.), issued Aug. 15, 2000; U.S. Pat. No. 6,482,551 (Dhar et al.), issued Nov. 19, 2002; U.S. Pat. No. 6,650,447 (Curtis et al.), issued Nov. 18, 2003, U.S. Pat. No. 6,743,552 (Setthachayanon et al.), issued Jun. 1, 2004; U.S. Pat. No. 6,765,061 (Dhar et al.), Jul. 20, 2004; U.S. Pat. No. 6,780,546 (Trentler et al.), issued Aug. 24, 2004; U.S. Patent Application No. 2003-0206320, published Nov. 6, 2003, (Cole et al), and U.S. Patent Application No. 2004-0027625, published Feb. 12, 2004, the entire disclosure and contents of which are hereby incorporated by reference.

For the purposes of the present invention, the term "initial operating point" refers to the combination of laser diode current and ECLD wavelength that meet the power and wavelength requested at the start of the AMC algorithm (within the limits of the power and wavelength range) and that satisfy the search the largest single-mode contrast ratio plateau (if this part of the AMC algorithm is enabled).

For the purposes of the present invention, the terms "laser coherence length" and "coherence length of the laser" refer to a measure of the bandwidth of the optical spectrum of a laser or laser diode. The coherence length is related to the tolerable path length difference between the reference and data beams by the fact that a larger optical bandwidth has a larger spectral width, and equivalently a shorter coherence length. A shorter coherence length results in a shorter tolerable optical path length difference between the reference and data beams, which may manifest itself as a weaker interference pattern, and hence a weaker hologram strength, until the hologram strength reaches or approaches zero (no hologram) when the path difference is equal to the coherence length.

For the purposes of the present invention, the term "laser diode" refers to a laser where the active medium is a semiconductor similar to that found in a LED which may operate to generate, produce, etc., a laser light (beam), and which may have a single wavelength (single-mode) or multiple wavelengths (multimodes).

For the purposes of the present invention, the term "light emitting diode" (LED) refers to a semiconductor diode which may be a source of light and which may have a single wavelength or multiple wavelengths. An LED may be used as positional light source.

For the purposes of the present invention, the terms "mode" and "longitudinal mode" refer interchangeably to a wavelength (or wavelengths) of light generated by a laser light source.

For the purposes of the present invention, the term "multimode threshold" refers to the level of contrast ratio below which a laser is too incoherent to produce a good hologram.

Figure 5:
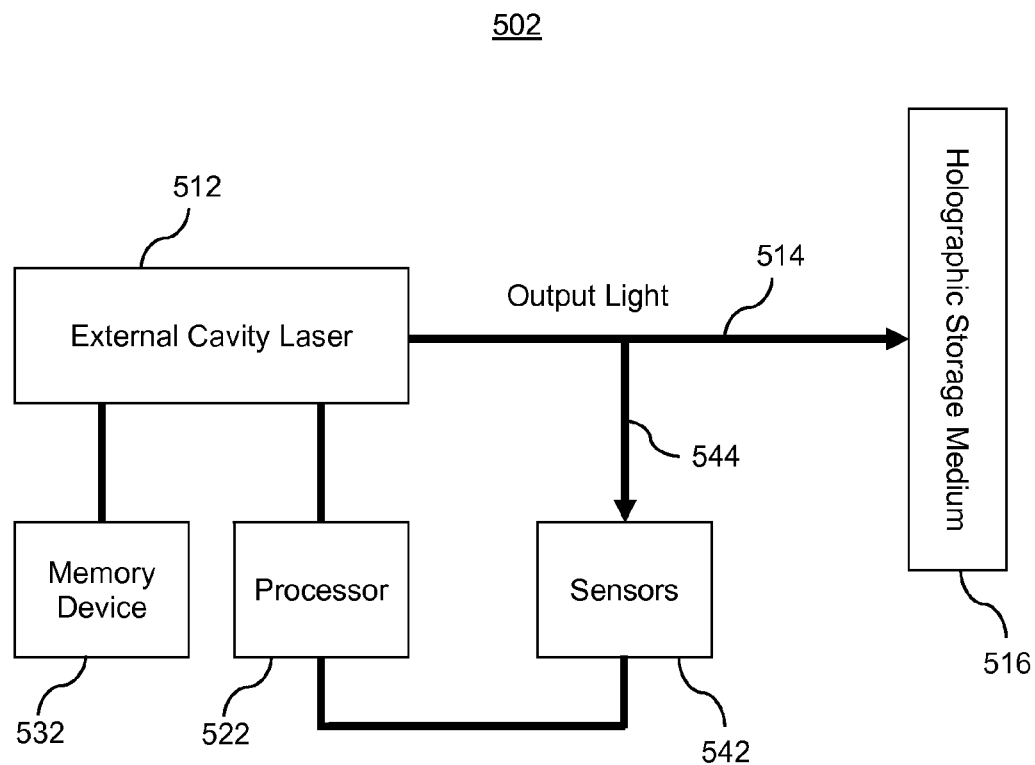
FIG. 5 shows in schematic form the operation of an apparatus according to one embodiment of the present invention.

For the purposes of the present invention, the terms "multimode" and "multiple longitudinal mode" refer interchangeably to multiple wavelengths of light generated by the laser light source. For example, a multi-mode laser diode produces multiple wavelengths of light with significant power. FIG. 5 of commonly-assigned U.S. Pat. No. 7,397,571 (Krneta et al.), issued Jul. 8, 2008, the entire disclosure and contents of which is hereby incorporated by reference, illustrates an exemplary fringe pattern for a multi-mode laser.

For the purposes of the present invention, the term "operating current" refers to the laser diode current at which a laser is presently operating.

For the purposes of the present invention, the term "positional light source" refers to a source of light which may be used for determining, directly or indirectly, the position of a diffraction grating.

For the purposes of the present invention, the term "processor" refers to a device capable of, for example, executing instructions, implementing logic, calculating and storing values, etc. Exemplary processors may include application specific integrated circuits (ASIC), central processing units, microprocessors, such as, for example, microprocessors commercially available from Intel and AMD, etc.

For the purposes of the present invention, the term "reading data" refers to retrieving, recovering, or reconstructing holographic data stored in a holographic storage medium.

For the purposes of the present invention, the term "recording data" refers to storing or writing holographic data in a holographic storage medium.

For the purposes of the present invention, the term "recording light" refers to a light source used to record information, data, etc., into a holographic storage medium.

For the purposes of the present invention, the term "set point threshold" refers to a value of contrast ratio for a laser below which the AMC process of the present invention starts to adjust the current or wavelength of the laser. The set-point threshold value is higher than the multimode threshold value. The set-point threshold value may be defined as a fixed offset above the multimode threshold, to ensure that the laser has some margin in the contrast ratio during which to adjust the current or wavelength before declaring the laser is multimode. Alternatively, the set-point threshold value may be defined relative to the distribution of contrast ratio values measured for laser diode current and ECLD wavelength in the operating range of the current and wavelength. The set-point threshold value of the contrast ratio may be defined such that the laser has contrast ratio values below the set-point for only a certain percentage of the possible values of current and wavelength. The percentage may be about 30%, but could also be much lower such as 5%.

For the purposes of the present invention, the term "single-mode operation" refers to a laser operating above the multimode threshold.

For the purposes of the present invention, the term "single-mode plateau" refers to any region of a contrast ratio which is above (higher than) the multimode threshold and whose slope is below a defined criteria, such as the contrast ratio does not change more than 3 units with each 50 microamp change in the laser diode current.

Figure 4:
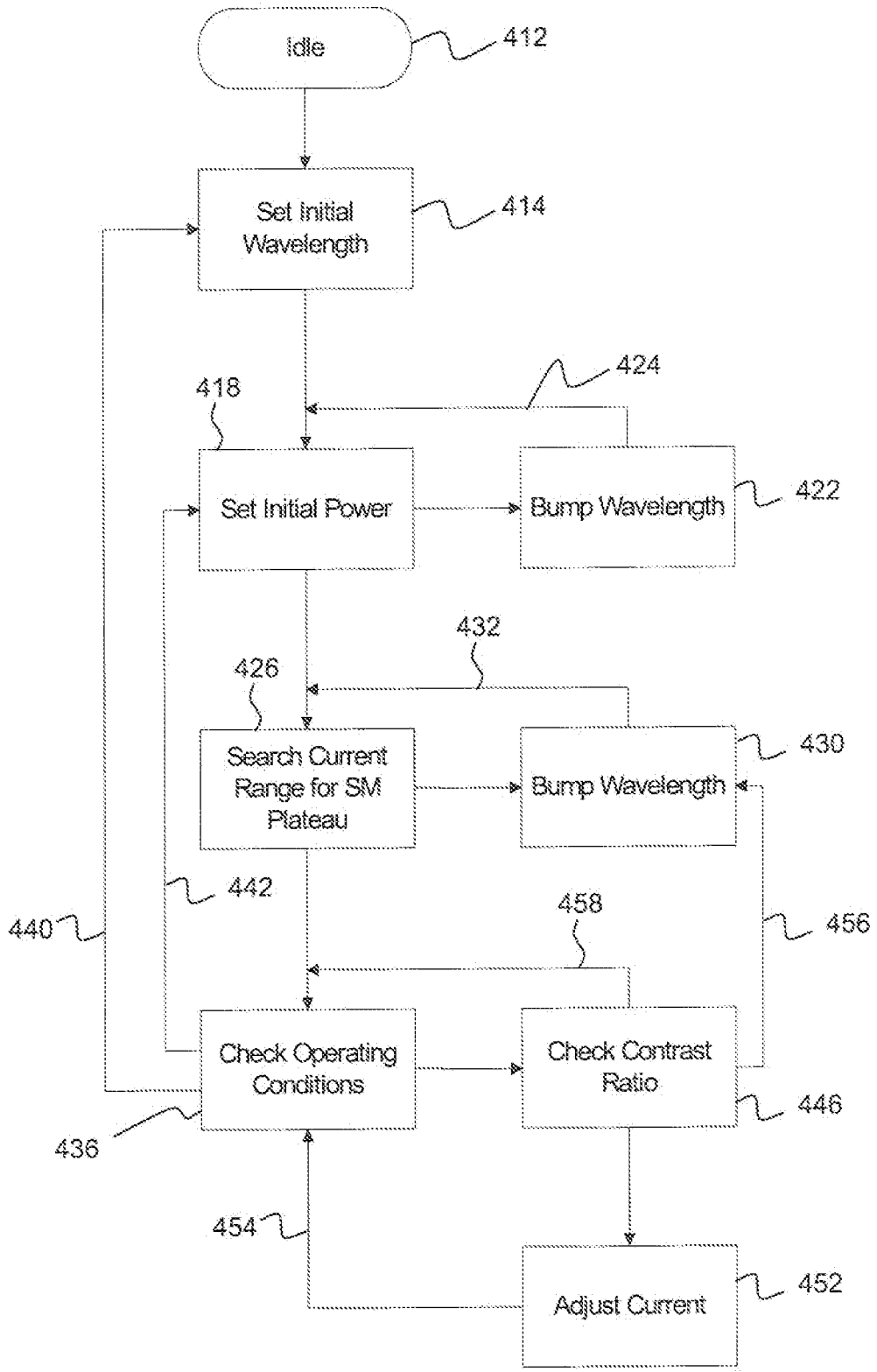
FIG. 4 is a flowchart illustrating an Automatic Mode Control (AMC) process according to one embodiment of the present invention.

For the purposes of the present invention, the terms "single-mode" and "single longitudinal mode" refer interchangeably to a single wavelength of light generated by a laser light source. For example, a single-mode laser diode produces a single dominant wavelength. FIG. 4 of commonly-assigned U.S. Pat. No. 7,397,571 (Krneta et al.), issued Jul. 8, 2008, the entire disclosure and contents of which is hereby incorporated by reference, illustrates an exemplary fringe pattern for a single-mode laser.

For the purposes of the present invention, the term "spatial light modulator" refers to a data modulator device that is an electronically controlled, active optical element.

For the purposes of the present invention, the term "tunable parameter" refers to a parameter which may be used to tune a laser. Tunable parameters may include the laser current, the wavelength of the output light, the temperature of the laser diode or collimator, the temperature of the baseplate, the alignment of the cavity by a mechanical adjustment mechanism, etc.

For the purposes of the present invention, the term "tunable transmission grating" refers to a transmissive diffraction grating in which the particular wavelength of light reflected may be adjusted.

For the purposes of the present invention, the term "wavelength step" refers to a fixed amount that the wavelength of the output light of a laser may be adjusted in a AMC process according to one embodiment of the present invention.

For the purposes of the present invention, the term "wobble threshold" or "dither threshold" refers to a maximum range of values that the contrast ratio is allowed to change with a step change in the laser diode current (such as 50 microamps per step) before the laser makes a change in the current. For instance, in one application the wobble threshold might be set to 3 contrast ratio units. During a current dither cycle, the current may be stepped up and down by 50 microamp steps. If as a result of either an up or down step the contrast ratio changes by more than 3 units, then the average current level would be stepped either up or down (depending on the direction that caused the change in contrast ratio).

DESCRIPTION

In holographic data storage, lasers with a coherence length longer than the path length difference between the reference path and data path of the interferometer need to be used. If the optical path length difference is longer than the coherence length of the laser, then the phase of light in the reference path become uncorrelated with the phase of light in the data path, which reduces the intensity of the interference fringes that form the hologram. In general, these lasers having longer coherence lengths are more expensive, cumbersome, and fragile. The least expensive, most robust lasers available, laser diodes, may not have the necessary coherence length to record (write) holograms. External cavity laser diodes (ECLDs) may be tuned so as to have a long enough coherence length, or equivalently a more pure frequency output (referred to hereafter as a "single-mode operation"). But ECLDs may be susceptible to environmental changes such as temperature swings and air currents between the laser diode and the external diffraction grating, i.e., in the external laser cavity. In order to continuously record (write) holograms for extended periods of time, it may be necessary to detect fluctuations in the ECLD properties (wavelength, power, contrast ratio, etc.) as the environment changes and to adapt input and/or output parameters to the ECLD to keep the ECLD in single-mode operation.

ECLDs which are correctly designed and operating properly have a histogram of the form such as that of histogram 100 shown in FIG. 1. Histogram 100 shows the number of occurrences of each contrast ratio for an ECLD adjusted over a range of laser diode currents and a range of ECLD wavelengths. Histogram 100 has several distinct features: a multimode region indicated by double-headed arrow 112, a multimode threshold indicated by line 114 and a single-mode region indicated by double-headed arrow 116. One feature is the large weighting of contrast ratios in single-mode region 116. The more occurrences that an ECLD has in region 116 of histogram 100, the better the ECLD tends to operate. In other words, given random fluctuation of the parameters described above, the ECLD may be most likely to operate with a contrast ratio in the single-mode regions 116 of histogram 100. Each ECLD may have several different value regions of contrast ratios which correspond to several different behaviors of the ECLD during operation, known as the chip mode, external cavity multimode, and external cavity single-mode. The contrast ratio may be higher for each of these modes, respectively. Moreover, the laser may behave with a mixture of laser cavity modes of different amplitudes in optical power due to multiple external cavity modes and multiple modes of the cavity formed by the laser diode chip. Misaligned lasers generally have histograms with two additional peaks (not shown) located to the left of peak 122 in FIG. 1 that represent the chip mode and external cavity multimode operation. Because a single-mode operation is desirable, multimode threshold 114 is used to determine the threshold of "good" (acceptable) versus "bad" (unacceptable) ECLD operation. Holograms recorded (written) with an ECLD which has a contrast ratio higher than multimode threshold 108 are considered "good" (acceptable) holograms. While the contrast of the hologram interference pattern may not suddenly disappear when the ECLD contrast ratio crosses to the left of multimode threshold 114, it may decrease rapidly from this point downward along the slope of histogram 100 to the left of peak 122.

Typically a mode histogram of the type shown in FIG. 1 consists of a range of current covering 3 to 8 mA and a range of wavelength covering 2 to 6 nm.

Generally, if the histogram resembles that shown in FIG. 1 then the large feature at the right side of the histogram indicates an ECLD that predominantly operates in a single-mode of operation. The width of the feature indicates the range of behavior the laser exhibits. For example, a narrow feature indicates a laser with consistently single-mode behavior. The maximum value of the contrast ratio indicates how well-aligned the mode sensor is, as well as details of the suppression of incoherent light during single-mode operation.

Embodiments of the present invention may use a certain process, known as an Automatic Mode Control, or "AMC," process to tune ECLDs used in holographic data storage in order to achieve longer periods of stable single-mode operation. The AMC process is thus used to keep the ECLD tuned to operate as a single-mode laser. The tunable parameters may include the laser current and the output light wavelength. Adjusting the laser diode current alters the temperature of the ECLD by a small amount, on the order of about to 3 to 4° C. per milliamp of current. The output light wavelength may be adjusted by changing the diffraction grating angle for the laser using techniques such as those described in commonly assigned U.S. patent application Ser. No. 12/457,498, entitled "SYSTEM AND DEVICES FOR IMPROVING EXTERNAL CAVITY DIODE LASERS USING WAVELENGTH AND MODE SENSORS AND COMPACT OPTICAL PATHS" (Ensher et al.), filed Jun. 12, 2009, the entire contents and disclosure of which is hereby incorporated by reference.

In other embodiments, the present invention may use laser diode temperature, or laser baseplate temperature, as part of the AMC process. Alternatively, the alignment of the laser cavity might be part of the AMC process whereby one or more mechanical mechanisms might adjust the alignment of the laser diode or collimator relative to the diffraction grating.

ECLDs that use the AMC process may contain a linear sensor array to measure the degree of the ECLD being in a single-mode state, as described in commonly assigned U.S. patent application Ser. No. 12/457,498, entitled "SYSTEM AND DEVICES FOR IMPROVING EXTERNAL CAVITY DIODE LASERS USING WAVELENGTH AND MODE SENSORS AND COMPACT OPTICAL PATHS" (Ensher et al.), filed Jun. 12, 2009, the entire contents and disclosure of which is hereby incorporated by reference. The metric used to measure the degree of the ECLD being in a single-mode state may be the contrast ratio, and/or interchangeably, the fringe visibility. The number for the contrast ratio may be in the range of from 0 (representing the output from a highly multimode source, such as the sun) to 1 (representing the output from a perfect, single-frequency source). For lasers with narrow spectral linewidths and long coherence lengths, this metric may be above about 0.8 and for small cavity, non-selective gain lasers, such as an individual diode, this number may be below about 0.2.

When tuning the current in an ECLD, the contrast ratio metric may range from a relatively low number (representing a multimode operation) to a relatively high number (representing a single-mode operation). An illustrative plot of such tuning is shown in FIG. 2, and is indicated generally as 200. As shown in FIG. 2, plot 200 has several "plateaus," indicated as 212, 214, 216, and 218, as well as several "valleys," indicated as 222, 224, 226, and 228 where the contrast ratio is relatively constant as the diode current changes. The structure of the contrast ratio versus laser current plot may be different depending upon any very small variation of temperature, air currents, grating angle, vibration in the system, etc. For example, the structure may vary in the following ways: The depth of the valleys in the contrast ratio vs. current may be increased. The length of the contrast ratio plateaus may become shorter or longer. The depth and height of the valleys and plateaus, respectively, may remain unchanged, but the number of valleys and plateaus may increase as the number of transitions from low-to-high increases, indicating more frequent mode hops).

If the contrast ratio is measured versus the ECLD current for many different angles of the diffraction grating, a histogram of different measured contrast ratios may be assembled, compiled, constructed, and/or obtained, etc., such as the one illustrated in FIG. 2 and generally indicated as 200. With a large enough number of such measurements, the histogram of contrast ratios for any ECLD may remain the same, regardless of variations in current, wavelength, temperature, and/or air currents, etc. In one embodiment of the present invention, a sufficient number of measurements is about 500 to 5000 This assembled compiled, constructed, and/or obtained, etc., histogram 200 may therefore be one method for determining how well the ECLD tends to work what range the contrast ratio metric may span on a single ECLD; and/or what contrast ratio threshold may be required for holography, etc.

In one embodiment, the AMC process of the present invention comprises two distinct parts. The first part of the AMC process is related to choosing the best initial operating point in both wavelength and current provided for the laser. The second part of the process is related to tracking the best operating point if there are variations in temperature, air current, and/or any other unknown mechanism which causes the laser to shift the preferred operating point of the laser.

In one embodiment, the AMC process of the present invention is designed to keep a laser in single-mode operation, without firmware assistance, by bumping the current and wavelength values small amounts if the contrast ratio falls below a control set-point. The hardware also contains support for searching a range of currents to find the center of a range in which the laser is in single-mode, which is an optimization that may be enabled or disabled depending on what else is occurring with the laser and how much time is available.

In one embodiment, when the AMC process is initialized, the user or holographic data storage drive knows the desired operating power and wavelength. The first two steps of the initialization portion of the AMC process are to swing (pivot or rotate) the diffraction grating to the proper angular location to lase (operate) at the desired initial wavelength, and then to either increase or decrease (adjust) the ECLD current until the desired initial power output is achieved. The wavelength and power of ECLD are both measured with external sensors as described and shown in commonly assigned U.S. patent application Ser. No. 12/457,498, entitled "SYSTEM AND DEVICES FOR IMPROVING EXTERNAL CAVITY DIODE LASERS USING WAVELENGTH AND MODE SENSORS AND COMPACT OPTICAL PATHS" (Ensher et al.), filed Jun. 12, 2009, the entire contents and disclosure of which is hereby incorporated by reference. FIGS. 1, 2, 5, 6, and 10 of Ensher et al. show embodiments of a wavelength sensor. FIGS. 11 and 12 of Smith et al. show embodiments of a mode sensor. FIG. 13 of Ensher et al. shows how a beam transmitted through a mode sensor embodiment reaches a power sensing photodiode, mounted to a printed circuit board as shown in FIG. 13. FIG. 23 of Ensher et al. shows creating and redirecting non-output beams from a grating for sensing laser properties such as mode, wavelength and power. Even though the current and diffraction grating angle of the ECLD are completely defined by the desired power and wavelength respectively, it may still be necessary to adjust these parameters to make the ECLD operate with single-mode behavior.

The next step of the initialization portion of the AMC process is to sweep the ECLD current by a small amount around the initial operating current provided to the ECLD while measuring the contrast ratio. A change in ECLD current may also cause a change in the ECLD output power, but the amount of the ECLD current sweep may be chosen to be small enough so that the hologram signal amplitude and signal-to-noise ratio may not be affected or are minimally affected, such as by changing the signal-to-noise ratio by less than about 1 dB. During the ECLD current sweep operation, shown generally by plot 300 in FIG. 3, the ECLD current is first swept up, and then swept down, generating two sweep curves similar to those shown in FIG. 3, which are indicated, respectively, as up current sweep 312 and down current sweep 314. Also shown in FIG. 3 is the multimode threshold, which is indicated by solid horizontal line 322, and a second, higher threshold, the set point threshold, which is indicated by dashed line 324. Any region of the contrast ratio that is above (higher than) multimode threshold line 322 is known as a single-mode plateau. Up current sweep 312 includes three single-mode plateaus 332, 334 and 336. Down current sweep 314 also includes three single-mode plateaus 342, 344 and 346. An overlapping single-mode plateau 352 is formed where single-mode plateau 332 and 342 overlap. An overlapping single-mode plateau 354 is formed where single-mode plateau 334 and 344 overlap. An overlapping single-mode plateau 356 is formed where single-mode plateau 336 and 346 overlap. Overlapping single-mode plateaus 352, 354 and 356 have respective widths shown by respective double-headed arrows 362, 364 and 366. The AMC process first looks for an overlapping single-mode plateau higher than a set-point threshold line 324 that has a power output within the acceptable power range. In one embodiment of the present invention, the acceptable power range may be provided by the user or the holographic drive. The range of optical powers accepted may be determined by the range of hologram signal-to-noise ratios produced by the range of optical powers, where an acceptable signal-to-noise ratio (SNR) range might be 1 dB.

If one or more such overlapped single-mode plateaus exist, such as overlapped single-mode plateaus 352, 354 and 356, the ECLD current is set to the middle of the widest single-mode overlapped plateau, (e.g., midpoint 358 of overlapped single-mode plateau 354 in FIG. 3). Up current sweep also includes valleys 372, 374 and 376. Down current sweep 314 also includes valleys 382, 384 and 386.

If single-mode plateaus exist, but none of the single-mode plateaus overlap in the current range swept, the ECLD current is then set to a current, the operating current, which is at or proximate the midpoint of the widest single-mode plateau. The current is also set by approaching the operating current in the direction of current sweep that produces the largest single-mode plateau. For example, if the widest single-mode plateau is found during down current sweep 312, then the ECLD current is reset to the highest current value in sweep 312, and then decreased to reach the midpoint of that widest single-mode plateau. The final possibility is that no single-mode plateaus above (higher than) the set-point threshold and within the power tolerance are found. In this case, the wavelength is tuned by one or more small steps, where the total wavelength change is within the acceptable wavelength range, with the current sweep procedure, described above, then being repeated. In one embodiment, the wavelength steps may be about 10 picometers each.

When the initialization part of the AMC process is finished and an operating current and wavelength have been chosen, the ECLD should be operating in a single-mode regime. The job of finding a single-mode operating point (e.g., midpoint 358) would then be complete if the ECLD were not so sensitive to variations in temperature, air currents, potentially vibrations, etc. However, over time, the plateau structure, such as that shown by 300 in FIG. 3, of the ECLD tends to change. If the single-mode plateau currently being used for the single-mode operating point drifts to a higher (or lower) current range, as well as far enough away from the original current range so that the chosen operating current falls off the single-mode plateau being used, the ECLD may cease to be in a single-mode operation.

The second part of the AMC process is used to track changes in this plateau structure (i.e., the structure of the single-mode plateaus, either in size or position), and adjusting the ECLD current based on the tracked changes to follow a single-mode operating point for the ECLD. One embodiment of a mechanism used to track changes in the single-mode plateau structure is a current dither. During the operation of the AMC process, the ECLD current may be quickly dithered back and forth (a "current dither cycle") one or more times between two very similar current values, i.e. current values separated by a current step, while measuring the contrast ratio. For example, the amount of current dither used may be 50 microamps (mA), with the contrast ratio being measured, for example, eight (8) times for each current dither cycle to provide an average or mean contrast ratio value for each cycle of eight measurements. In other embodiments, only one to three samples of the contrast ratio may be used to increase the speed of response of the current dither cycle. If the difference in two consecutive measurements of the average or mean contrast ratio is greater than a chosen or selected dither threshold, the operating current may be changed to a current value providing a higher contrast ratio. The dither threshold may be chosen to be small, i.e. between about 3 and 7. A small dither threshold forces the AMC process to change the ECLD current more often which may lead to instabilities in the laser performance, such as rapidly changing contrast values as the AMC attempts to dither on or near the edge of a contrast ratio plateau. If the wobble threshold is chosen to be large i.e. between about 10 and 30, this may keep the single-mode operating point more stable, but may not track plateau shifts, to a higher or lower current range, as quickly. For a contrast ratio scale of from 0 to 1, the wobble threshold may be generally set to between about 0.003 and about 0.01.

In effect, the embodiment of this current dither mechanism or procedure described above allows the ECLD to test the contrast ratio both above and below the operating current. If the current dither mechanism or procedure determines that one direction is significantly better, i.e. produces an increase in the contrast ratio greater than the dither threshold, then the ECLD current is changed to utilize the new and better operating point. If neither direction is much better then the operating current must be on top of a flat single-mode plateau, and nothing is (needs to be) changed.

An embodiment of a current dither mechanism or procedure for tracking the single-mode plateaus works if these single-mode plateaus are changing at a slower rate than the measurement of two consecutive current dither cycles. Even with a dedicated field-programmable gate array (FPGA) making the measurements on a millisecond time scale, the single-mode plateaus may still drop away faster into adjacent valleys than the AMC process may track. Usually, these rapid changes in the single-mode plateau structure of the ECLD are due to some mechanical vibration of the diffraction grating, or the laser diode and collimator lens. Rapid changes in the single-mode plateau structure can also occur immediately after a sudden change in temperature of the laser, or due to transient changes in the mechanical alignment of the grating laser diode or collimator that might occur due to shock, or an accumulation of vibration or temperature that induces a sudden relaxation of mechanical stress.

If the AMC process automatically uses a current dither mechanism or procedure to push the process to the largest single-mode plateaus, the AMC process can get lost in the valleys (e.g., 372, 374, 376, 382, 384 and 386), which are also flat enough to keep the ECLD current from changing. To avoid this pitfall, the AMC process ignores the dither threshold if the contrast ratio drops below the set-point threshold 324. In this scenario, the current dither is used to determine the direction to change the current regardless of the change in the contrast ratio relative to the dither threshold (see FIG. 3). If no single-mode plateau is found within a certain amount of time, the AMC process may be re-initialized to find the nearest single-mode operating current and wavelength. The re-initialization process may consist of returning the laser to the initial power and wavelength requested at the start of AMC. With well-aligned ECLDs, such as the one used to make histogram 100 shown in FIG. 1, any random walk of the ECLD current quickly locates a suitable single-mode plateau.

FIG. 4 illustrates one embodiment of an AMC process 402 of the present invention. When process 402 is off or not being used, process 402 is in an idle state 412. At step 414, a laser is set to an initial wavelength. At step 418, process 402 attempts to set an initial power output by setting the initial power of the laser. If the desired initial power output of the laser cannot be achieved because mode hops cause the power to fluctuate larger than the maximum power range, the laser wavelength is bumped at step 422 by a wavelength step to a new current wavelength. Once the laser wavelength is bumped at step 422, step 418 is then repeated as indicated by arrow 424. Once the initial power output is set to the starting requested power for the laser, automatic mode control process 402 conducts a current sweep to find an SM plateau at step 426. If no SM plateaus are found, the current wavelength is bumped at step 430 by a wavelength step to a new current wavelength. Once the laser wavelength is bumped, step 426 is then repeated as indicated by arrow 432. Once one or more SM plateaus are found, the current is set to a value in the middle of the largest SM plateau and step 436 is conducted. At step 436, the wavelength is measured. If the measured wavelength is outside the AMC wavelength range, then step 414 is performed as indicated by arrow 440. Then the power output of the laser is measured at step 436. If the measured output power is outside the allowed power range, then step 418 is performed as indicated by arrow 442. Once the measured wavelength is inside the AMC wavelength range and the measured output power is inside the allowable power range, the contrast ratio is checked at step 446. If at step 446 the contrast ratio is above the set-point threshold, the contrast ratio is simply checked again as indicated by arrow 458. If at step 446, the contrast ratio is below the control set point threshold, then, the current is adjusted at step 452 and the operating conditions i.e. the measured AMC wavelength and measured output power, are checked again at step 436 as indicated by arrow 454. If at step 446, the current is beyond the maximum current range, the wavelength is bumped at step 430 as indicated by arrow 456, and step 426 is performed as indicated by arrow 432.

Although the process of FIG. 4 is described above employing a single current sweep at step 426, in one embodiment, the AMC process of the present invention conducts two or more current sweeps at step 426 to find one or more overlapped SM plateaus. Once one or more overlapped SM plateaus are found, the current is set to a value in the middle of the largest overlapped SM plateau and step 436 is conducted.

In one embodiment of the present invention, the user chooses or the holographic storage drive will know, based on information stored in memory, the optical power that is requires for writing good holograms. Based on this optical power, the user or holographic storage drive can issue the command to enter the AMC process, because the laser knows how to implement a power request into a current request. Alternatively, the calibration for power to current may reside in the drive or be chosen by the user, so that the current command is sent to the laser.

In one embodiment of the present invention, the initial wavelength is set using a value that is stored in the firmware for a processor implementing the AMC process of the present invention.

In one embodiment of the present invention, the starting requested power using a value that is stored in the firmware for a processor implementing the AMC process of the present invention. If the set initial power procedure fails because of an iteration error (i.e. the power was not able to be set in the programmed number of iterations), the wavelength may be bumped by a wavelength step before trying to set the power again.

In one embodiment of the present invention, if the search current range optimization is enabled, a processor implementing the AMC process selects an optimized current value within a maximum current range. Otherwise, the processor stays with the current found during the set initial power step. If the search current range optimization is enabled and a valid operating range is not found, the wavelength may be bumped by a wavelength step before the processor searching the current range again.

In one embodiment of the present invention, the check operating conditions procedure step performs several functions. If the measured wavelength is outside of the expected wavelength range, the processor implementing the AMC process goes back and sets the wavelength to be within the defined precision. Note that the "expected wavelength range" is a range around the current expected wavelength, which may not be the same as the initial wavelength because of wavelength bumps. The wavelength check has the highest priority. If the measured power is outside of the expected power range (as defined by a maximum power range memory bit), the processor goes back and set the power to be within the defined precision. The power check has the second highest priority. If both wavelength and power are within the maximum wavelength and power range, respectively, the processor continually checks the contrast ratio. If contrast ratio drops below the control set-point, the current is adjusted. Note that the wavelength and power are checked during each mode detection, and the values are updated if they are found to be outside the valid range at any time. There are several real-time control bits that influence the above steps. The firmware for the processor has the ability to enable or disable the current and wavelength updates to correspond with writing/reading holograms. Since current and wavelength updates during writes/reads may cause errors, the updates need to be disabled during the write/reads. If firmware has disabled the current update operation, the processor simply goes back to checking the mode even if it determines that the contrast ratio is below the control set-point but above the multimode threshold. If the current update operation is enabled but the wavelength update operation is disabled, the processor returns to checking the mode even if it wants to update the wavelength. Only when firmware determines that updates are safe and the operations are enabled does the processor change the current and/or wavelength.

In one embodiment of the present invention, updates of wavelength and power may be controlled in real-time via input pins to a processor that implements the AMC process of the present invention. When the processor determines that the laser is in a single-mode state, based on data from the sensors for the laser, a current update memory bit for the processor is set to "0", so that current updates are not allowed. The AMC wobble process does not toggle back and forth between currents, but instead just monitors the contrast ratio. When the processor determines that the laser is no longer in a single-mode state, based on data from the sensors for the laser, the current update memory bit for the processor is set to "1" and the wobble process runs and the current is able to be updated. Note that the wavelength is not updated if current update memory bit is set to "0". Wavelength updates may be restricted in real-time via a wavelength update memory bit. If the wavelength update memory bit is set to "0", the wavelength is not be bumped by the process. (Note that, if the process wants to bump the wavelength and is unable to, an AMC failure may result.) If this wavelength update memory bit is set to "1", the wavelength is able to be bumped by the processor. Wavelength bumping is also enabled or disabled via a tune wavelength bit for the processor. If the tune wavelength bit is a "0", the update wavelength memory bit is ignored. If wavelength tuning bit is a "1" and wavelength update bit is also a "1", then a wavelength bump may take place. If a current increment or decrement would push the actual current beyond the valid range specified by the current range parameter, the processor has the option of incrementing the wavelength by a wavelength step, and then reverting to current control to keep the laser in single-mode at the new wavelength. This only continues until an increment of the wavelength pushes the wavelength of the output light outside the maximum wavelength range. Once outside this range, the processor stops implementing the AMC process and the processor sends and interrupt signal to firmware.

In one embodiment of the present invention, in the "search current range for SM plateau" step, for each wavelength, the range of currents with the maximum current range may be searched to find the largest range where the laser is in single-mode and the measured power is within a valid range. The processor then sets the current to the middle value in this range with the hope that the laser stays in single-mode operation for a long time. When this optimization is enabled via an optimize current bit, the processor begins with the lowest current value in the range. The processor then increments the current by a current step throughout the range defined by the maximum current range, checking the laser mode and power after each current update. The processor keeps track of and stores the starting and ending current values for the largest range in which the laser is in single-mode and the measured power for the laser is within the valid range specified by the maximum power range. The processor then decrements the current from the maximum current value in the maximum current range back to the starting current, also keeping track of and storing the starting and ending current values for the largest range in which the laser is in single-mode and the measured power of the laser is within the valid range specified by maximum power range. Once the sweep has been completed in both directions, the two ranges of single-mode operation are compared and the larger of the two is chosen. The processor then determines the center value of the selected range. The final step in this procedure is for the processor to set the current to the center value of the optimized range. This is accomplished by stepping the current in the direction of current ramp that produced the larger plateau until the center current value is reached.

As mentioned above, in one embodiment of the present invention, the wavelength and power are continuously measured during each contrast ratio calculation. If the wavelength or power falls out of a valid range, a processor implementing the AMC process of the present invention may go back to an earlier state to set the wavelength or power back within a valid operating range. While the wavelength and power is measured concurrently with each contrast ratio calculation, the choice of setting the wavelength or power back into a valid range is controlled by firmware. If a check wavelength enable bit is "1", then the processor sets the wavelength back to the expected value for the wavelength if the measured wavelength is outside the maximum range specified by a maximum wavelength range memory bit. Note that the maximum wavelength range memory bit specifies a range around the last wavelength set. That wavelength may be the initial wavelength set at the start of the processor implementing the AMC process or the wavelength may be the initial wavelength incremented by one or more wavelength steps. Note that the maximum wavelength range value should be more than twice as large as the laser wavelength precision value for the laser, or else the AMC process may enter an infinite loop trying to continuously reset the wavelength. If a check power enable memory bit is "1", then the processor sets the power back to its expected value if the measured power is outside the maximum specified by the maximum power range memory bit. Note that the maximum power range memory bit specifies a range around the initial power. Also note that the maximum power range value should be more than twice as large as the laser power precision value, or else the AMC process could enter into an infinite loop trying to continuously reset the power.

In one embodiment of the present invention, the search current range optimization step described previously sets the current to the middle of the largest single-mode plateau. But plateaus drift and sometimes erode away with temperature and other operating condition changes. The main AMC loop (steps 430, 436, 446 and 452 of flowchart 402) attempts to keep the laser operating point away from the edge of a single-mode plateau, allowing the laser to respond to changes and keeping it in single-mode operation longer, reducing the number of reported multimode errors. The main AMC loop has two (2) parts. The first part is a plateau tracker process that attempts to keep the current set to the middle of the plateau as it drifts or erodes. The two (2) currents at the edges of the plateau are saved. At the beginning of each write of a book of holographic pages of data, the current is changed to the two (2) edges and contrast ratio is measured again at both edges. If the contrast ratios at both edges are still good, i.e. above the set-point threshold, no change is made. If one contrast ratio is good and the other bad, it is assumed the plateau is drifting and the two (2) edge currents are both bumped one (1) step in the direction of the good contrast ratio by a current step. If both are bad, it is assumed the plateau is eroding and the edge currents are both bumped one (1) step towards the middle of the plateau. The process preferably loops eight (8) times to check and adjust the plateau edges. The current is then set to the middle between the new plateau edges and the contrast ratio is checked there. If good, the current is left at the plateau midpoint. If bad, the current is restored to what it was before the plateau tracker process started. The second part is a process that adjusts the current during book writes if contrast ratio drops below the control set-point. It works by continually checking the contrast ratio measured at the present current. The checking process may examine more than one sample of the contrast ratio and in certain embodiments may check the average contrast ratio of the most similar 2 out of every 3 measurements of the contrast ratio in order to suppress transient or erroneous measurements. If the average of two contrast ratio values is below the control set-point, current is bumped one (1) step, in whichever direction improved contrast ratio in the past. The contrast ratio is measured at the second current and the two (2) values are compared. The laser current is then adjusted in the direction of the larger contrast ratio. If contrast ratios are below the control set-point but above the multimode set-point, current is adjusted by one (1) step. If either is below the multimode set-point, current is adjusted two (2) steps.

The processor implementing the AMC process of the present invention may be any type of suitable processor. In one embodiment, the processor is a field-programmable gate array (FPGA).

In the AMC process shown in FIG. 4 and described above, the values for the initial wavelength, starting requested power, wavelength step, wavelength range, initial power output, allowable power range, and other values used in the AMC process may be stored on a memory chip or other type memory device in a holographic storage device. In another embodiment of the present invention, these values may be set by a user. In one embodiment of the present invention, these values may be stored on a memory chip or other type of memory device in a laser module that may be mounted in a holographic storage device. In one embodiment of the present invention, these values may be stored on a memory chip or other type of memory device in storage module of holographic storage device in which laser may be mounted.

In one embodiment of the present invention, instructions for implementing the AMC process of the present invention may be stored in a memory chip of a holographic storage device that includes a processor for implementing the AMC process. An example of a holographic storage device including a memory chip that may be programmed with the instructions for implementing the AMC process are described and shown in the Tapestry™ 300r storage drive from InPhase Technologies. In one embodiment of the present invention instructions for implementing the AMC process of the present invention may be stored in memory chip of a laser module a holographic storage device that includes a processor for implementing the AMC process. Examples of ECLD modules including memory chips that may be programmed with the instructions for implementing the AMC process are described and shown in the NUV601E from Nichia Corporation using an M25P40 programmable read only memory chip from ST Microelectronics, as well as FIG. 3 of U.S. Pat. No. 7,397,571 (Krneta et al.), issued Jul. 8, 2008, and FIG. 1 of U.S. Patent Application No. 2007/0223554 (Hunter et al.), filed Mar. 9, 2007, the entire disclosure and contents of which are hereby incorporated by reference. In one embodiment of the present invention instructions for implementing the AMC process of the present invention may be stored in memory chip of a storage module a holographic storage device in which a laser module may be mounted.

FIG. 5 shows an apparatus 502 according to one embodiment of the present invention including a laser 512, with an output light, indicated by arrow 514, used to record holograms on a holographic storage medium 516. Laser 512 may be an external cavity laser such as an external cavity diode laser. A processor 522 determines if laser 512 is operating in a single mode state. Processor 522 also determines the degree to which one or more tunable parameters for laser 512 must be adjusted so that laser 512 operates in a single-mode state if not operating in a single-mode state. These one or more tunable parameters include the following parameters: the laser current and the wavelength of the output light. A memory device 532 stores information for a multimode threshold and/or a set-point threshold for laser 512. This information is used to determine if the laser is operating in a single-mode state. One or more sensors 542 sense a portion of the output light, indicated by arrow 544, to provide data to processor 522 on the degree to which laser 512 is operating in a single-mode state.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method comprising the following steps:
   (a) determining if a laser is operating in a single-mode state, the laser having a laser current, a laser temperature, and an output light having a wavelength;
   (b) if the laser is determined to not be operating in a single-mode state in step (a), determining a degree to which one or more tunable parameters for the laser must be adjusted so that the laser operates in a single-mode state if not operating in a single-mode state, wherein the one or more tunable parameters is selected from the group consisting of the laser current, the laser temperature, and the wavelength of the output light;
   (c) adjusting the one or more tunable parameters of the laser by an amount determined in step (b);
   (d) determining if one or more measured parameters of the laser are within a desired range after the adjustment made in step (c), wherein the one or more measured parameters include laser output power and laser wavelength;
   (e) if the one or more measured parameters are determined in step (d) to not be within the desired range, determining a new adjustment to the one or more tunable parameters for placing the one or more measured parameters within the desired range;
   (f) performing the new adjustment to the one or more tunable parameters according to the determination of step (e); and
   (g) repeating steps (a) through (f) until the laser is operating in a single-mode state and the one or more measured parameters are within the desired range.

2. The method of claim 1, wherein the one or more tunable parameters includes the laser current.

3. The method of claim 2, further comprising determining a current range for a single-mode plateau for a single current sweep for the laser and setting the laser current at a midpoint of the current range for the single-mode plateau.

4. The method of claim 3, wherein the single-mode plateau is a widest single-mode plateau for the single current sweep.

5. The method of claim 2, further comprising determining a current range for an overlapping single-mode plateau for two or more current sweeps for the laser and setting the laser current at a midpoint of the current range for the single-mode plateau.

6. The method of claim 5, wherein the overlapping single-mode plateau is a widest overlapping single-mode plateau for the two or more current sweeps.

7. The method of claim 5, wherein at least one of the current sweeps is an up sweep and at least one of the current sweeps is a down sweep.

8. The method of claim 1, wherein the tunable parameter includes the wavelength of the output light.

9. The method of claim 8, wherein step (c) comprises bumping the wavelength of the output light by a wavelength step if the laser output power cannot be set to selected power due to mode hops causing the laser output power to fluctuate beyond a specified range.

10. The method of claim 1, wherein the one or more tunable parameters includes the laser current and the wavelength of the output light.

11. The method of claim 1, wherein the laser is a diode laser.

12. The method of claim 1, wherein the laser is an external cavity laser.

13. The method of claim 12, wherein the laser is an external cavity laser diode.

* * * * *